US012745622B2

(12) United States Patent
Nalamalpu et al.

(10) Patent No.: US 12,745,622 B2
(45) Date of Patent: Sep. 22, 2026

(54) DIE-TO-DIE POWER DELIVERY

(71) Applicant: Altera Corporation, San Jose, CA (US)

(72) Inventors: Ankireddy Nalamalpu, Portland, OR (US); Mahesh K. Kumashikar, Bangalore (IN); Atul Maheshwari, Portland, OR (US); Lai Guan Tang, Tanjung Bungah (MY)

(73) Assignee: Altera Corporation, San Jose, CA (US)

( * ) Notice: Subject to any disclaimer, the term of this patent is extended or adjusted under 35 U.S.C. 154(b) by 55 days.

(21) Appl. No.: 17/957,217

(22) Filed: Sep. 30, 2022

(65) Prior Publication Data

US 2023/0024662 A1 Jan. 26, 2023

(51) Int. Cl.

*H10W 20/41* (2026.01)
*H03K 19/17736* (2020.01)
*H03K 19/1776* (2020.01)
*H10W 20/49* (2026.01)
*H10W 90/00* (2026.01)
*H10W 72/20* (2026.01)

(52) U.S. Cl.

CPC .... *H10W 20/427* (2026.01); *H03K 19/17744* (2013.01); *H03K 19/1776* (2013.01); *H10W 20/49* (2026.01); *H10W 90/00* (2026.01); *H03K 19/1774* (2013.01); *H10W 72/267* (2026.01)

(58) Field of Classification Search

CPC .................................................. H01L 23/5286
USPC ......................................................... 257/734
See application file for complete search history.

(56) References Cited

U.S. PATENT DOCUMENTS 10,833,679 B2 11/2020 Clark et al.
2016/0049941 A1 2/2016 How et al.
2021/0296234 A1* 9/2021 Dechene ............... H01L 21/743
2022/0199537 A1* 6/2022 Qian ................... H01L 25/0657

* cited by examiner

*Primary Examiner* — Ajay Arora
(74) *Attorney, Agent, or Firm* — Fletcher Yoder, P.C.

(57) ABSTRACT

A die includes one or more power delivery layers to deliver power within the die. Additionally, the die also includes one or more transistor layers to at least partially implement a programmable fabric for the die. Furthermore, the die further includes one or more signal routing layers to transmit signals for use by the programmable fabric. Moreover, the one or more transistor layers physically separate the one or more power delivery layers from the one or more signal routing layers.

20 Claims, 7 Drawing Sheets

150
154
152
142
158
148
IO FABRIC
146
140
156
144

DIE-TO-DIE POWER DELIVERY

BACKGROUND

The present disclosure relates generally to routing in a multi-die package. More particularly, the present disclosure relates to power delivery for die-to-die connections in a multi-die package.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Integrated circuits, such as field programmable gate arrays (FPGAs) are programmed to perform one or more particular functions. Multiple integrated circuit devices (e.g., chips or die) may be coupled together in a package that incorporates interconnections between the integrated circuit devices. However, these interconnections may utilize resources (e.g., microbumps) from the fabric region creating an encroachment on the fabric region instead of adding additional silicon area making the package larger. This encroachment may result in degraded power delivery or loss of fabric routing as routing resources from either power delivery or fabric routing is used. To address the degraded power delivery, an IR drop guardband may be applied uniformly across the die potentially reducing power efficiency.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Silicon packages may have multiple die in the package that utilize die-to-die interfaces to enable communication between the multiple die. However, these die-to-die interfaces may be limited by bump pitch. Some number of bumps may be located with an input/output (I/O) area. However, if the bump pitch requires more bumps than are available in the I/O area, there are two options: 1) expand the I/O area using more silicon or 2) use bumps associated with a compute/fabric area. Since package area is often key, the die-to-die interface may often utilize bumps in the fabric area. Using these bumps may encroach into the fabric region thereby blocking routing resources from being used for fabric routing since they are used for and/or degrading power delivery. Degraded power delivers may at least partially result from relatively long distance between power delivery bumps and target locations and/or other routing limitations. To deal with power delivery degradation, the die may utilize an IR drop guardband that may be applied uniformly across the die thereby potentially reducing power efficiency for the whole die. Alternatively, as discussed below, a metal layer for transporting signals may be separated from a power delivery metal layer. This separation may improve power delivery quality due to the proximity of the bumps to respective circuitry (e.g., transistors).

Figure 1:
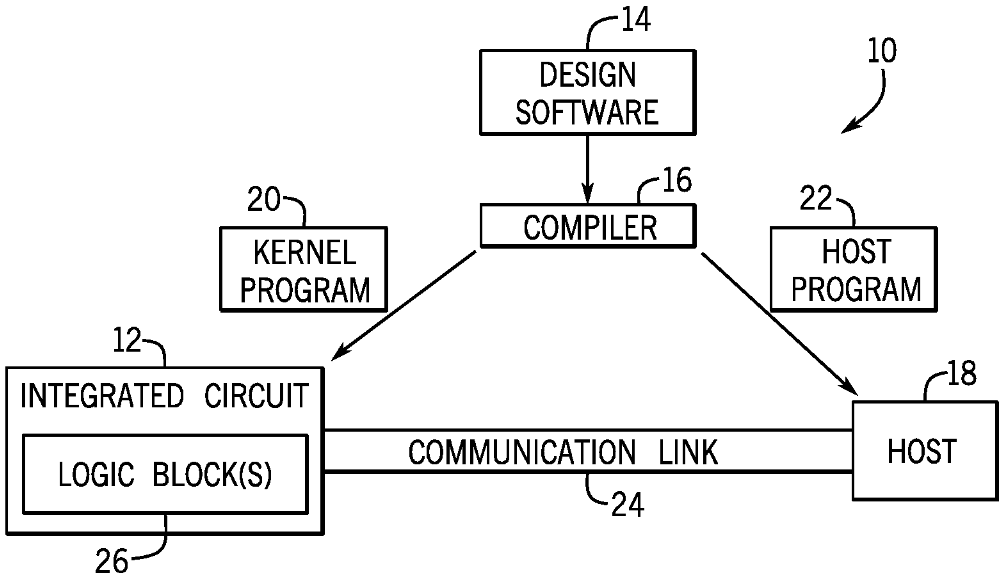
FIG. 1 is a block diagram of a system used to program an integrated circuit device, in accordance with an embodiment of the present disclosure.

With the foregoing in mind, FIG. 1 illustrates a block diagram of a system 10 that may implement arithmetic operations. A designer may desire to implement functionality, such as the operations of this disclosure, on an integrated circuit device 12 (e.g., a programmable logic device, such as a field programmable gate array (FPGA) or an application specific integrated circuit (ASIC)). In some cases, the designer may specify a high-level program to be implemented, such as an OPENCL® program, which may enable the designer to more efficiently and easily provide programming instructions to configure a set of programmable logic cells for the integrated circuit device 12 without specific knowledge of low-level hardware description languages (e.g., Verilog or VHDL). For example, since OPENCL® is quite similar to other high-level programming languages, such as C++, designers of programmable logic familiar with such programming languages may have a reduced learning curve than designers that are required to learn unfamiliar low-level hardware description languages to implement new functionalities in the integrated circuit device 12.

The designer may implement high-level designs using design software 14, such as a version of INTEL® QUARTUS® by INTEL CORPORATION. The design software 14 may use a compiler 16 to convert the high-level program into a lower-level description. In some embodiments, the compiler 16 and the design software 14 may be packaged into a single software application. The compiler 16 may provide machine-readable instructions representative of the high-level program to a host 18 and the integrated circuit device 12. The host 18 may receive a host program 22 which may be implemented by the kernel programs 20. To implement the host program 22, the host 18 may communicate instructions from the host program 22 to the integrated circuit device 12 via a communications link 24, which may be, for example, direct memory access (DMA) communications or peripheral component interconnect express (PCIe) communications. In some embodiments, the kernel programs 20 and the host 18 may enable configuration of a logic block 26 on the integrated circuit device 12. The logic block 26 may include circuitry and/or other logic elements and may be configured to implement arithmetic operations, such as addition and multiplication.

The designer may use the design software 14 to generate and/or to specify a low-level program, such as the low-level hardware description languages described above. Further, in some embodiments, the system 10 may be implemented without a separate host program 22. Moreover, in some embodiments, the techniques described herein may be implemented in circuitry as a non-programmable circuit design. Thus, embodiments described herein are intended to be illustrative and not limiting.

Figure 2:
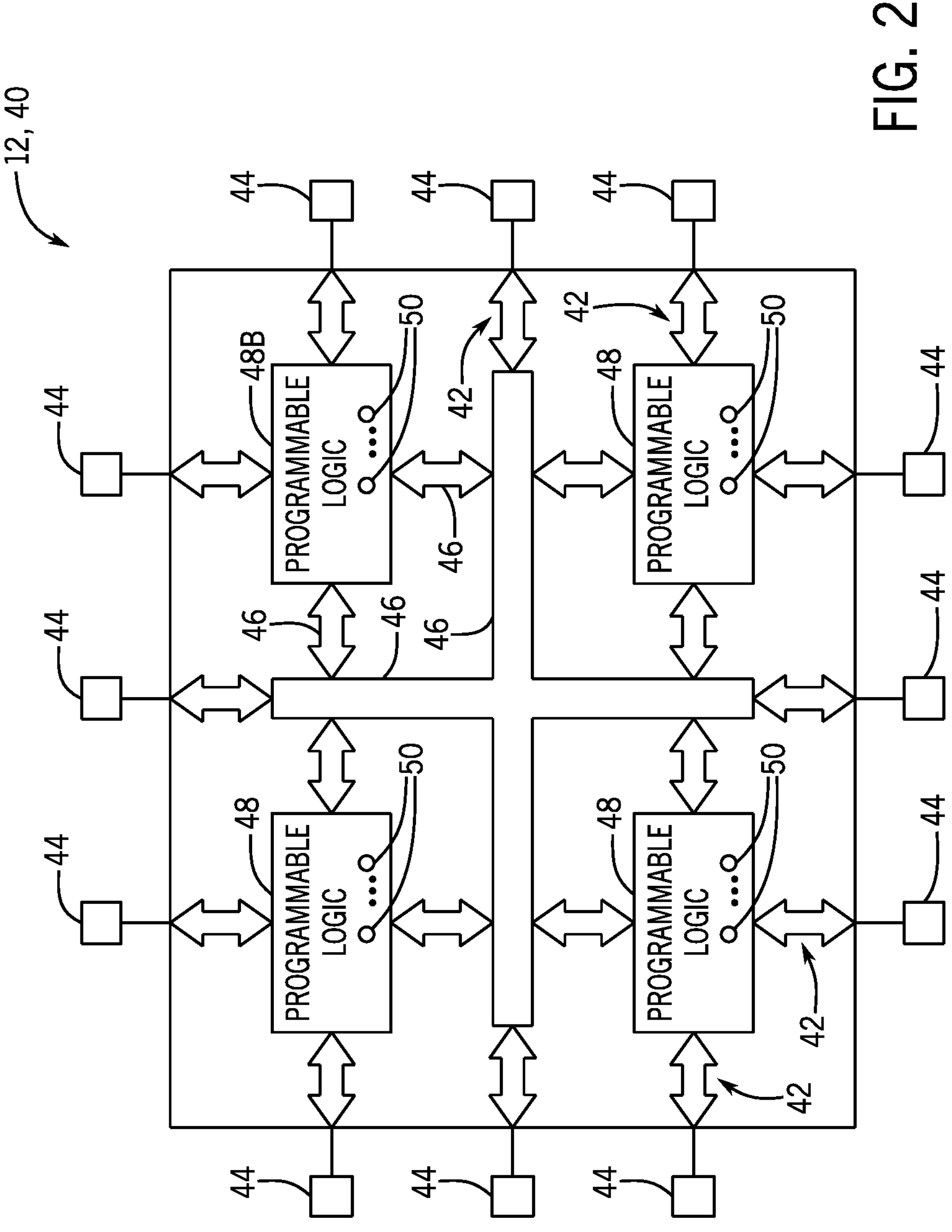
FIG. 2 is a block diagram of the integrated circuit device of FIG. 1, in accordance with an embodiment of the present disclosure.

Turning now to a more detailed discussion of the integrated circuit device 12, FIG. 2 is a block diagram of an example of the integrated circuit device 12 as a programmable logic device, such as a field-programmable gate array (FPGA). Further, it should be understood that the integrated circuit device 12 may be any other suitable type of programmable logic device (e.g., an ASIC and/or application-specific standard product). The integrated circuit device 12 may have input/output (IO) circuitry 42 for driving signals off device and for receiving signals from other devices via input/output pins 44. Interconnection resources 46, such as global and local vertical and horizontal conductive lines and buses, and/or configuration resources (e.g., hardwired couplings, logical couplings not implemented by user logic), may be used to route signals on integrated circuit device 12. Additionally, interconnection resources 46 may include fixed interconnects (conductive lines) and programmable interconnects (i.e., programmable connections between respective fixed interconnects). Programmable logic 48 may include combinational and sequential logic circuitry. For example, programmable logic 48 may include look-up tables, registers, and multiplexers. In various embodiments, the programmable logic 48 may be configured to perform a custom logic function. The programmable interconnects associated with interconnection resources may be considered to be a part of programmable logic 48.

Programmable logic devices, such as the integrated circuit device 12, may include programmable elements 50 with the programmable logic 48. In some embodiments, at least some of the programmable elements 50 may be grouped into logic array blocks (LAB s). As discussed above, a designer (e.g., a customer) may (re)program (e.g., (re)configure) the programmable logic 48 to perform one or more desired functions. By way of example, some programmable logic devices may be programmed or reprogrammed by configuring programmable elements 50 using mask programming arrangements, which is performed during semiconductor manufacturing. Other programmable logic devices are configured after semiconductor fabrication operations have been completed, such as by using electrical programming or laser programming to program programmable elements 50. In general, programmable elements 50 may be based on any suitable programmable technology, such as fuses, antifuses, electrically programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming, configuration data is loaded into the memory cells using input/output pins 44 and input/output circuitry 42. In one embodiment, the memory cells may be implemented as random-access-memory (RAM) cells. The use of memory cells based on RAM technology as described herein is intended to be only one example. Further, since these RAM cells are loaded with configuration data during programming, they are sometimes referred to as configuration RAM cells (CRAM). These memory cells may each provide a corresponding static control output signal that controls the state of an associated logic component in programmable logic 48. For instance, in some embodiments, the output signals may be applied to the gates of metal-oxide-semiconductor (MOS) transistors within the programmable logic 48.

Figure 3:
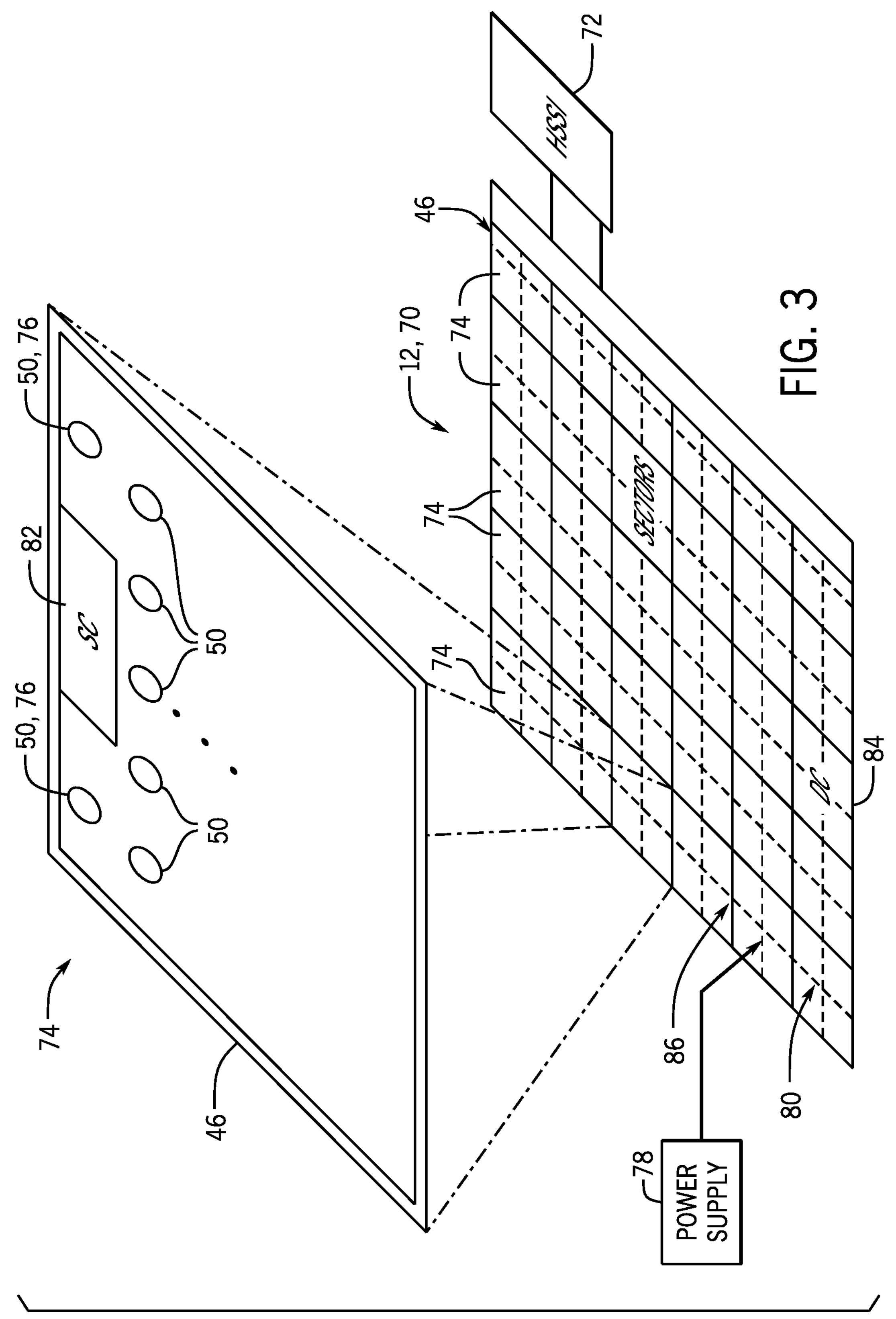
FIG. 3 is a diagram of programmable fabric of the integrated circuit device of FIG. 1, in accordance with an embodiment of the present disclosure.

The integrated circuit device 12 may include any programmable logic device such as a field programmable gate array (FPGA) 70, as shown in FIG. 3. For the purposes of this example, the FPGA 70 is referred to as an FPGA, though it should be understood that the device may be any suitable type of programmable logic device (e.g., an application-specific integrated circuit and/r application-specific standard product). In one example, the FPGA 70 is a sectorized FPGA of the type described in U.S. Patent Publication No. 2016/0049941, "Programmable Circuit Having Multiple Sectors," which is incorporated by reference in its entirety for all purposes. The FPGA 70 may be formed on a single plane. Additionally or alternatively, the FPGA 70 may be a three-dimensional FPGA having a base die and a fabric die of the type described in U.S. Pat. No. 10,833,679, "Multi-Purpose Interface for Configuration Data and User Fabric Data," which is incorporated by reference in its entirety for all purposes.

In the example of FIG. 3, the FPGA 70 may include transceiver 72 that may include and/or use input/output circuitry, such as input/output circuitry 42 in FIG. 2, for driving signals off the FPGA 70 and for receiving signals from other devices. Interconnection resources 46 may be used to route signals, such as clock or data signals, through the FPGA 70. The FPGA 70 is sectorized, meaning that programmable logic resources may be distributed through a number of discrete programmable logic sectors 74. Programmable logic sectors 74 may include a number of programmable logic elements 50 having operations defined by configuration memory 76 (e.g., CRAM). A power supply 78 may provide a source of voltage (e.g., supply voltage) and current to a power distribution network (PDN) 80 that distributes electrical power to the various components of the FPGA 70. Operating the circuitry of the FPGA 70 causes power to be drawn from the power distribution network 80.

There may be any suitable number of programmable logic sectors 74 on the FPGA 70. Indeed, while 29 programmable logic sectors 74 are shown here, it should be appreciated that more or fewer may appear in an actual implementation (e.g., in some cases, on the order of 50, 100, 500, 1000, 5000, 10,000, 50,000 or 100,000 sectors or more). Programmable logic sectors 74 may include a sector controller (SC) 82 that controls operation of the programmable logic sector 74. Sector controllers 82 may be in communication with a device controller (DC) 84.

Sector controllers 82 may accept commands and data from the device controller 84 and may read data from and write data into its configuration memory 76 based on control signals from the device controller 84. In addition to these operations, the sector controller 82 may be augmented with numerous additional capabilities. For example, such capabilities may include locally sequencing reads and writes to implement error detection and correction on the configuration memory 76 and sequencing test control signals to effect various test modes.

The sector controllers 82 and the device controller 84 may be implemented as state machines and/or processors. For example, operations of the sector controllers 82 or the device controller 84 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may allow routines to have multiple variants depending on "modes" the local controller may be placed into. When the control program memory is implemented as RAM, the RAM may be written with new routines to implement new operations and functionality into the programmable logic sectors 74. This may provide usable extensibility in an efficient and easily understood way. This may be useful because new commands could bring about large amounts of local activity within the sector at the expense of only a small amount of communication between the device controller 84 and the sector controllers 82.

Sector controllers 82 thus may communicate with the device controller 84, which may coordinate the operations of the sector controllers 82 and convey commands initiated from outside the FPGA 70. To support this communication, the interconnection resources 46 may act as a network between the device controller 84 and sector controllers 82. The interconnection resources 46 may support a wide variety of signals between the device controller 84 and sector controllers 82. In one example, these signals may be transmitted as communication packets.

The use of configuration memory 76 based on RAM technology as described herein is intended to be only one example. Moreover, configuration memory 76 may be distributed (e.g., as RAM cells) throughout the various programmable logic sectors 74 of the FPGA 70. The configuration memory 76 may provide a corresponding static control output signal that controls the state of an associated programmable logic element 50 or programmable component of the interconnection resources 46. The output signals of the configuration memory 76 may be applied to the gates of metal-oxide-semiconductor (MOS) transistors that control the states of the programmable logic elements 50 or programmable components of the interconnection resources 46.

As discussed above, some embodiments of the programmable logic fabric may be configured using indirect configuration techniques. For example, an external host device may communicate configuration data packets to configuration management hardware of the FPGA 70. The data packets may be communicated internally using data paths and specific firmware, which are generally customized for communicating the configuration data packets and may be based on particular host device drivers (e.g., for compatibility). Customization may further be associated with specific device tape outs, often resulting in high costs for the specific tape outs and/or reduced salability of the FPGA 70.

Figure 4:
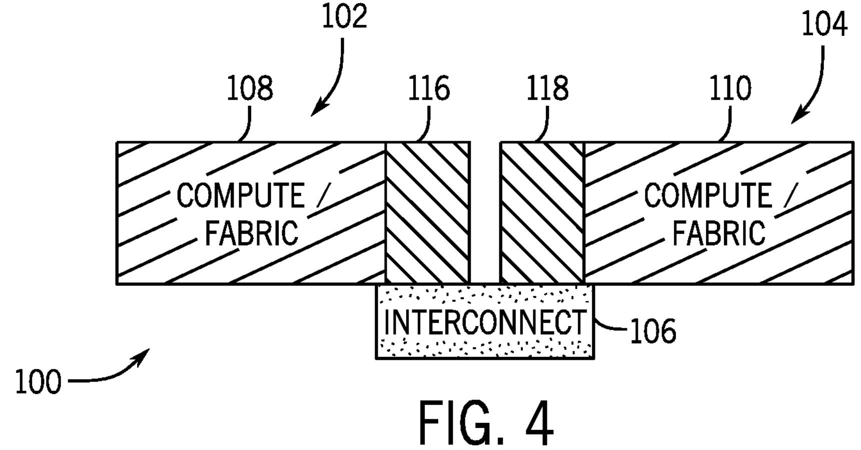
FIG. 4 is a block diagram of a multi-die package having die-to-die connections with a bridge or wires interconnecting the die, in accordance with an embodiment of the present disclosure.

With the foregoing in mind, FIG. 4 is a block diagram of a side view of a package 100 that includes two die 102 and 104. The die 102 and 104 may include integrated circuits and be the integrated circuit device 10 of FIG. 1. Additionally or alternatively, the die 102 and/or 104 may include any other integrated circuit devices (e.g., memory, memory controllers, CPUs, etc.) that may be used in a multi-die/multi-chip/multi-chiplet package. The die 102 and 104 are communicatively coupled together via an interconnect 106. For instance, the interconnect 106 may include a semiconductor bridge, an interposer, wire-bonded wires, and/or any other suitable interconnect.

As illustrated, the die 102 and 104 each include a respective compute or fabric core (e.g., compute/fabric) 108 and 110 that perform the functions (e.g., compute, store, etc.) of the respective die 102 and 104. The die 102 and 104 further include respective IO circuitries 116 and 118, such as IO circuitry 42, which enable the die 102 and 104 to communicate with each other and/or other electronic devices (e.g., escape the package to off-package devices).

Figure 5:
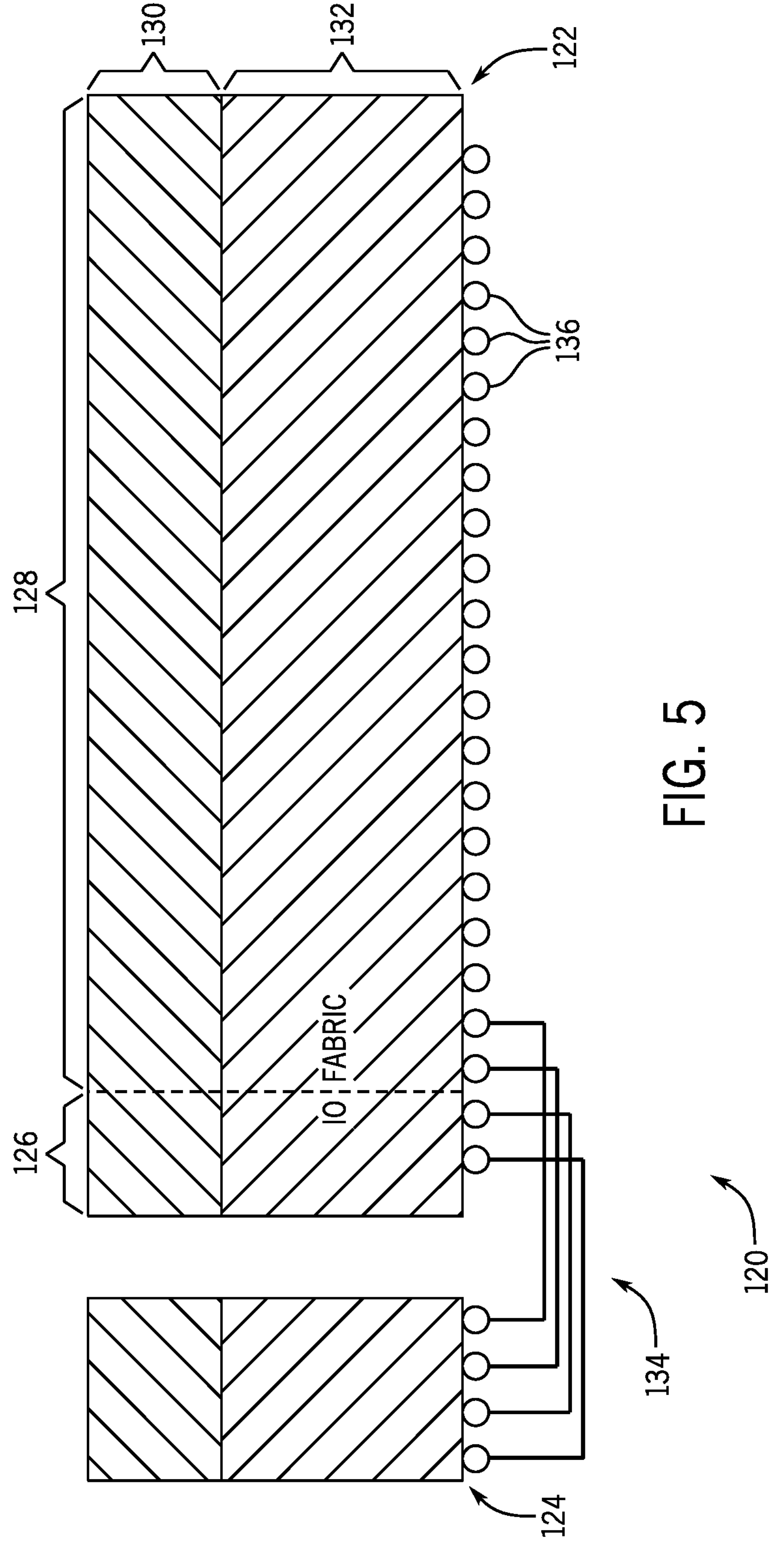
FIG. 5 is a block diagram of the multi-die package of FIG. 4 with one die having a programmable fabric and a single metal layer, in accordance with an embodiment of the present disclosure.

FIG. 5 is a block diagram of an embodiment of a multi-die package 120 that includes a die 122 and a die 124. The die 122 may have an IO circuitry 126 used to communicate with the die 124. The die 122 may be a programmable logic die that has a programmable fabric portion 128 that includes a programmable fabric. Furthermore, the IO circuitry 126 and/or the programmable fabric portion 128 may be divided into multiple layers. For example, the die 122 may include one or more transistor layers 130 that may be used to implement functions in the IO circuitry 126 and/or the programmable fabric portion 128. Furthermore, the die 122 may include one or more metal layers 132 used to perform routing and power delivery. As previously noted, the multi-die package 120 may utilize more interconnections 134 than there are available bumps 136 (e.g., microbumps or solder balls) in the area of the JO circuitry 126 due to the bump pitch of the bumps 136. Thus, at least some of the bumps 136 may be located in the programmable fabric portion 128. Using these bumps may encroach into the programmable fabric portion 128 thereby blocking routing resources from being used for fabric routing or power delivery potentially degrading power delivery. Degraded power delivery may at least partially result from relatively long distance between bumps 136 used for power delivery and target locations of the delivered power and/or other routing limitations. To deal with power delivery degradation, the die may utilize an IR drop guardband that may be applied uniformly across the die thereby potentially reducing power efficiency for the whole die.

As previously noted, the one or more metal layers 132 may be separated into a first metal layer for transporting signals and a second metal layer for power delivery. Furthermore, this separation of the metal layers may have the one or more transistor layers 130 between the two metal layers. This separation may improve power delivery quality due to the proximity of the bumps to respective circuitry (e.g., transistors).

Figure 6:
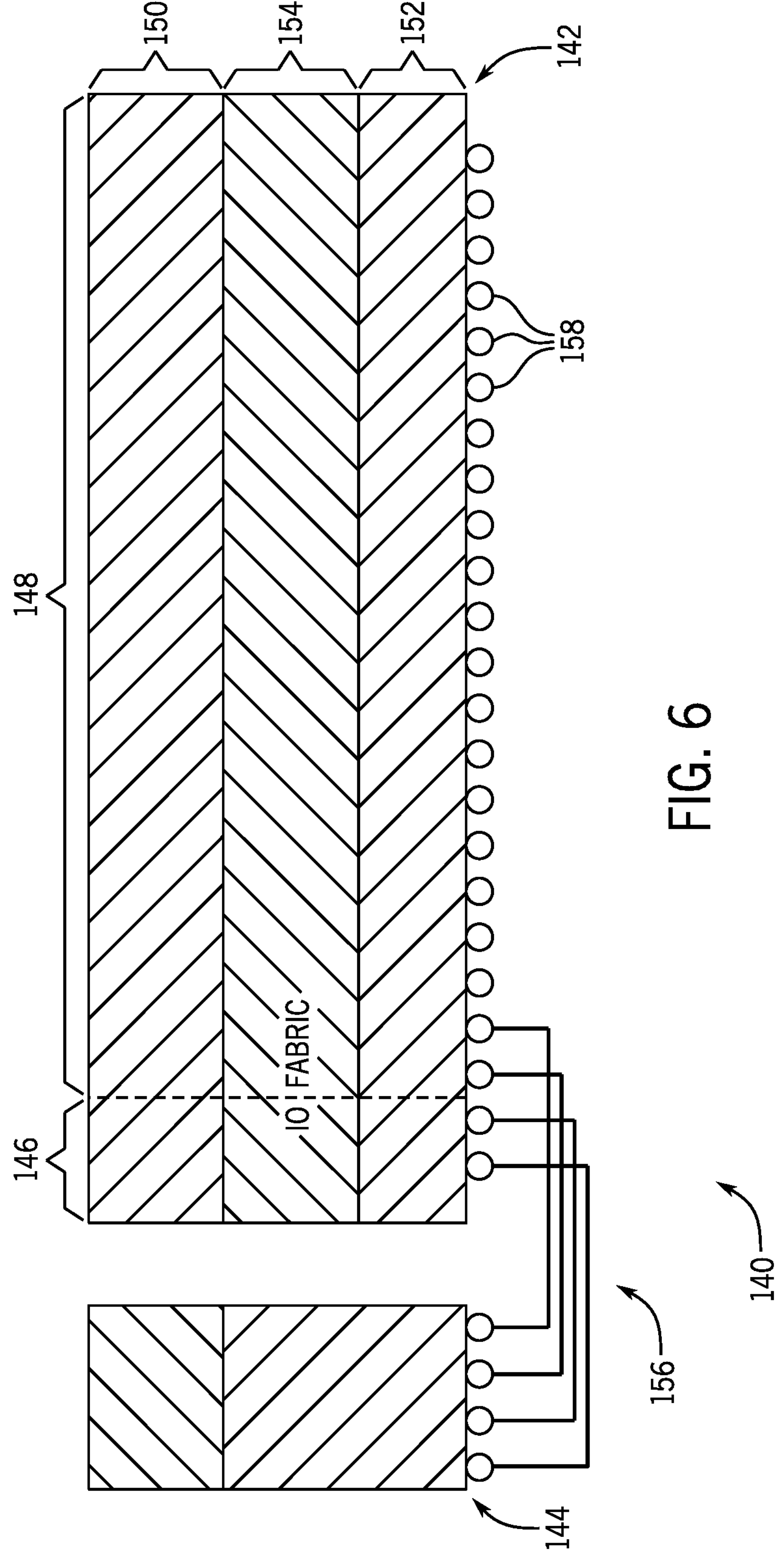
FIG. 6 is a block diagram of the multi-die package of FIG. 4 with one die having a programmable fabric and two metal layers, in accordance with an embodiment of the present disclosure.

With the foregoing in mind, FIG. 6 is a block diagram of an embodiment of a multi-die package 140 that includes a die 142 and a die 144. Like the die 122, the die 142 may have an JO circuitry 146 used to communicate with the die 144. Furthermore, the die 142 may be a programmable logic die that has a programmable fabric portion 148 that includes a programmable fabric. Furthermore, the JO circuitry 146 and/or the programmable fabric portion 148 may be divided into multiple layers with separate power delivery and signal routing layers. For example, the die 142 may include one or more transistor layers 154 may be used to implement functions in the IO circuitry 146 and/or the programmable fabric portion 148. Furthermore, the die 142 may include one or more signal routing layers 150 and one or more power delivery layers 152. In other words, the signal routing functions and the power delivery functions may be separated into different metal layers. Additionally, the one or more signal routing layers 150 may be separated from the one or more power delivery layers 152 by the one or more transistor layers 154. Furthermore, the multi-die package 140 may utilize more interconnections 156 than there are available bumps 158 (e.g., microbumps or solder balls) in the area of the IO circuitry 146 due to the bump pitch of the bumps 158. Thus, at least some of the bumps 158 may be located in the programmable fabric portion 148. Using these bumps may encroach into the programmable fabric portion 148. However, unlike the encroachment into the programmable fabric portion 128, the encroachment may not interfere with signal routing in the one or more signal routing layers 150. Furthermore, any potential encroachment into the one or more power delivery layers 152 may be minimized due to the lack of signal routing functions competing for the available resources. In fact, the limit for the use of backside metallization for die-to-die communication may instead by limited by what amount of data the one or more signal routing layers 150 can utilize. Furthermore, since the one or more transistor layers 154 are closer to the bumps 158 than the one or more transistor layers 130 are to the bumps 136, the die 142 may have improved power delivery quality. The die 142 may further have improved power delivery quality due to the availability to use metal-insulator-metal (MIM) capacitors in the die 142. Furthermore, the separation of the power delivery metal and signal routing metal may enable more routing and enable scaling of die-to-die interface designs in absence of bump pitch scaling. As shown in FIG. 6, the one or more signal routing layers 150 and the one or more power delivery layers 152 may be disposed/located on opposite sides of the die 142 and may be physically separated from each other by the one or more transistor layers 154. Furthermore, in some embodiments, the one or more signal routing layers 150 and the one or more power delivery layers 152 may occupy a whole side (e.g., top or bottom side) of the die 142 or may occupy only part of their respective sides. Moreover, in certain embodiments, such as that illustrated in FIG. 6, the one or more signal routing layers 150 and the one or more power delivery layers 152 may be arranged in parallel (e.g., vertically or horizontally) to each other with the one or more transistor layers 154 between them.

Figure 7:
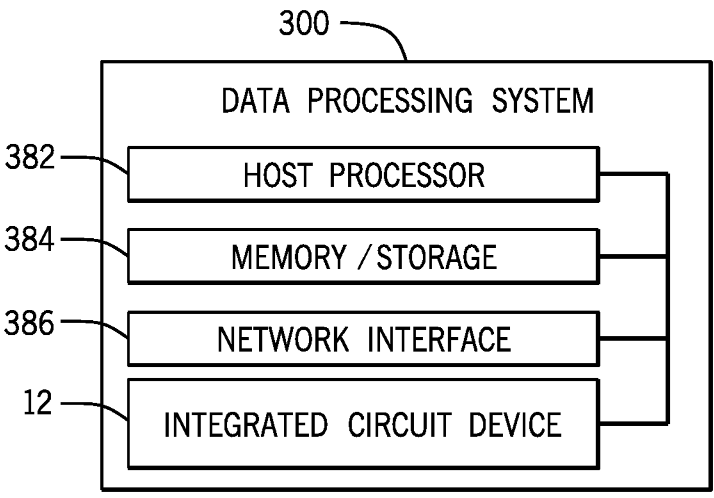
FIG. 7 is a block diagram of a data processing system, in accordance with an embodiment of the present disclosure.

Furthermore, the integrated circuit device 12, the package 120, and/or the package 140 may generally be a data processing system or a component, such as an FPGA, included in a data processing system 300. For example, the integrated circuit device 12, the package 120, and/or the package 140 may be a component of a data processing system 300 shown in FIG. 7. The data processing system 300 may include a host processor 382 (e.g., a central-processing unit (CPU)), memory and/or storage circuitry 384, and a network interface 386. The data processing system 300 may include more or fewer components (e.g., electronic display, user interface structures, application specific integrated circuits (ASICs)). The host processor 382 may include any suitable processor, such as an INTEL® Xeon® processor or a reduced-instruction processor (e.g., a reduced instruction set computer (RISC), an Advanced RISC Machine (ARM) processor) that may manage a data processing request for the data processing system 300 (e.g., to perform debugging, data analysis, encryption, decryption, machine learning, video processing, voice recognition, image recognition, data compression, database search ranking, bioinformatics, network security pattern identification, spatial navigation, or the like). The memory and/or storage circuitry 384 may include random access memory (RAM), read-only memory (ROM), one or more hard drives, flash memory, or the like. The memory and/or storage circuitry 384 may hold data to be processed by the data processing system 300. In some cases, the memory and/or storage circuitry 384 may also store configuration programs (bitstreams) for programming the integrated circuit device 12, the package 120, and/or the package 140. The network interface 386 may allow the data processing system 300 to communicate with other electronic devices. The data processing system 300 may include several different packages or may be contained within a single package on a single package substrate.

In one example, the data processing system 300 may be part of a data center that processes a variety of different requests. For instance, the data processing system 300 may receive a data processing request via the network interface 386 to perform acceleration, debugging, error detection, data analysis, encryption, decryption, machine learning, video processing, voice recognition, image recognition, data compression, database search ranking, bioinformatics, network security pattern identification, spatial navigation, digital signal processing, or some other specialized tasks.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

Example Embodiments

EXAMPLE EMBODIMENT 1. A die, comprising: one or more power delivery layers to deliver power within the die; one or more transistor layers to at least partially implement a programmable fabric for the die; and one or more signal routing layers to transmit signals for use by the programmable fabric, wherein the one or more transistor layers physically separate the one or more power delivery layers from the one or more signal routing layers.

EXAMPLE EMBODIMENT 2. The die of example embodiment 1, comprising bumps to enable power delivery to the die.

EXAMPLE EMBODIMENT 3. The die of example embodiment 2, wherein a first portion of the bumps are coupled to an input/output portion of the die and to an interconnect to at least partially connect the die to another die.

EXAMPLE EMBODIMENT 4. The die of example embodiment 3, wherein a second portion of the bumps are coupled to the interconnect and to a fabric portion of the die.

EXAMPLE EMBODIMENT 5. The die of example embodiment 1, wherein the one or more power delivery layers are on a first side of the die.

EXAMPLE EMBODIMENT 6. The die of example embodiment 5, wherein the one or more signal routing layers are on a second side of the die that is opposite to the first side.

EXAMPLE EMBODIMENT 7. The die of example embodiment 6, wherein the first side is a bottom side of the die, and the second side is a top side of the die.

EXAMPLE EMBODIMENT 8. The die of example embodiment 1, wherein the one or more signal routing layers and the one or more power delivery layers are vertically separated and parallel to each other.

EXAMPLE EMBODIMENT 9. A die, comprising: a power delivery metal layer located on a first side of the die and to deliver power within the die; a transistor layer comprising a plurality of transistors to at least partially implement a programmable fabric for the die; and a signal routing metal layer located on a second side of the die and to transmit signals for use by the programmable fabric, wherein the transistor layer physically separates the power delivery metal layer from the signal routing metal layer.

EXAMPLE EMBODIMENT 10. The die of example embodiment 9, comprising microbumps to enable power delivery to the die.

EXAMPLE EMBODIMENT 11. The die of example embodiment 10, wherein a first portion of the microbumps are coupled to an input/output portion of the die and to an interconnect to at least partially connect the die to another die.

EXAMPLE EMBODIMENT 12. The die of example embodiment 11, wherein a second portion of the microbumps are coupled to the interconnect and to a fabric portion of the die.

EXAMPLE EMBODIMENT 13. The die of example embodiment 9, wherein the first side and the second side are opposite of each other on the die.

EXAMPLE EMBODIMENT 14. The die of example embodiment 13, wherein the first side is a bottom side of the die, and the second side is a top side of the die.

EXAMPLE EMBODIMENT 15. The die of example embodiment 9, wherein the signal routing metal layer and the power delivery metal layer are vertically separated and parallel to each other.

EXAMPLE EMBODIMENT 16. A system, comprising: a first die; an interconnect coupled to the first die; and a second die, comprising: a power delivery metal layer to deliver power within the second die; a transistor layer comprising a plurality of transistors to at least partially implement a programmable fabric for the second die; and a signal routing metal layer to transmit signals for use by the programmable fabric, wherein the transistor layer physically separates the power delivery metal layer from the signal routing metal layer.

EXAMPLE EMBODIMENT 17. The system of example embodiment 16, wherein the power delivery metal layer is located on a first side of the second die.

EXAMPLE EMBODIMENT 18. The system of example embodiment 17, wherein the signal routing metal layer is on a second side of the second die that is opposite to the first side.

EXAMPLE EMBODIMENT 19. The system of example embodiment 18, wherein the first side is a bottom side of the second die, and the second side is a top side of the second die.

EXAMPLE EMBODIMENT 20. The system of example embodiment 16, wherein the signal routing metal layer and the power delivery metal layer are vertically separated and parallel to each other.

What is claimed is:

1. A system, comprising:

a first die; and a second die coupled to the first die, wherein the second die comprises:

one or more power delivery layers to deliver power within the second die, to deliver die-to-die signals to and from the first die, and to deliver clock signals;

one or more transistor layers to at least partially implement a programmable fabric for the second die;

one or more signal routing layers to transmit signals for use by the programmable fabric, wherein the one or more transistor layers physically separate the one or more power delivery layers from the one or more signal routing layers; and bumps to enable power delivery to the second die and to transmit IO signals to the one or more transistor layers through the one or more power delivery layers.

2. The system of claim 1, comprising an interconnect, wherein a first portion of the bumps are coupled to an input/output portion of the second die and to the interconnect to at least partially connect the second die to the first die.

3. The system of claim 2, wherein a second portion of the bumps are coupled to the interconnect and to a fabric portion of the second die.

4. The system of claim 1, wherein the one or more power delivery layers are on a first side of the second die.

5. The system of claim 4, wherein the one or more signal routing layers are on a second side of the second die that is opposite to the first side.

6. The system of claim 5, wherein the first side is a bottom side of the second die, and the second side is a top side of the second die.

7. The system of claim 1, wherein the one or more signal routing layers and the one or more power delivery layers are vertically separated and parallel to each other.

8. The system of claim 1, wherein first bumps of the bumps are configured to enable power delivery, and second bumps of the bumps are configured to transmit the IO signals, and the first bumps and the second bumps are formed along the same plane of the second die.

9. A package, comprising:

an interconnect;

a first die; and a second die coupled to the first die via the interconnect, wherein the second die comprises:

a transistor layer comprising a plurality of transistors to at least partially implement a programmable fabric for the second die; and a signal routing metal layer located on a first side of the second die and to transmit signals for use by the programmable fabric;

a power delivery metal layer located on a second side of the second die and to deliver power within the second die, wherein the transistor layer physically separates the power delivery metal layer from the signal routing metal layer, and the power delivery metal layer is to transport data between the first die and the second die without encroaching on the signal routing metal layer; and microbumps to enable power delivery to the second die and to transmit IO signals to the transistor layer through the power delivery metal layer.

10. The package of claim 9, wherein first microbumps of the microbumps are configured to enable power delivery, and second microbumps of the microbumps are configured to transmit the IO signals, and the first microbumps and the second microbumps are formed along the same plane of the second die.

11. The package of claim 10, wherein a first portion of the microbumps are coupled to an input/output portion of the second die and to the interconnect to at least partially connect the second die to the first die via the interconnect.

12. The package of claim 11, wherein a second portion of the microbumps are coupled to the interconnect and to a fabric portion of the second die.

13. The package of claim 10, wherein the first side and the second side are opposite of each other on the second die.

14. The package of claim 13, wherein the first side is a top side of the second die, and the second side is a bottom side of the second die.

15. The package of claim 10, wherein the signal routing metal layer and the power delivery metal layer are vertically separated and parallel to each other.

16. A system, comprising:

a first die;

an interconnect coupled to the first die; and a second die, comprising:

a power delivery metal layer to deliver power, die-to-die signals, and clock signals within the second die;

a transistor layer comprising a plurality of transistors to at least partially implement a programmable fabric for the second die;

a signal routing metal layer to transmit signals for use by the programmable fabric, wherein the transistor layer physically separates the power delivery metal layer from the signal routing metal layer; and bumps to enable power delivery to the second die and to transmit IO signals to the transistor layer through one or more power delivery layer.

17. The system of claim 16, wherein the power delivery metal layer is located on a first side of the second die.

18. The system of claim 17, wherein the signal routing metal layer is on a second side of the second die that is opposite to the first side.

19. The system of claim 18, wherein the first side is a bottom side of the second die, and the second side is a top side of the second die.

20. The system of claim 16, wherein the signal routing metal layer and the power delivery metal layer are vertically separated and parallel to each other.

* * * * *